(12) United States Patent
Chan et al.

(10) Patent No.: US 7,602,212 B1
(45) Date of Patent: Oct. 13, 2009

(54) FLEXIBLE HIGH-SPEED SERIAL INTERFACE ARCHITECTURES FOR PROGRAMMABLE INTEGRATED CIRCUIT DEVICES

(75) Inventors: Allen Chan, San Jose, CA (US); Sergey Shumarayev, Los Altos Hills, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 58 days.

(21) Appl. No.: 11/904,003

(22) Filed: Sep. 24, 2007

(51) Int. Cl.
*G06F 7/38* (2006.01)
*H03K 19/173* (2006.01)

(52) U.S. Cl. .......................................... 326/37; 716/16
(58) Field of Classification Search ................ None
See application file for complete search history.

(56) References Cited

U.S. PATENT DOCUMENTS

| | | | |
|---|---|---|---|
| 6,867,616 B1 * | 3/2005 | Venkata et al. ................ 326/41 |
| 6,963,223 B2 * | 11/2005 | Venkata et al. ................ 326/41 |
| 7,028,270 B1 * | 4/2006 | Lam et al. ........................ 716/1 |
| 7,272,677 B1 * | 9/2007 | Venkata et al. ................ 710/71 |
| 7,343,569 B1 * | 3/2008 | Lam et al. ........................ 716/1 |
| 2002/0190751 A1 * | 12/2002 | Lee et al. ......................... 326/39 |
| 2004/0032282 A1 * | 2/2004 | Lee et al. ......................... 326/39 |
| 2006/0095605 A1 * | 5/2006 | Lee et al. ......................... 710/36 |

* cited by examiner

*Primary Examiner*—Robert Pascal
*Assistant Examiner*—Dylan White
(74) *Attorney, Agent, or Firm*—Ropes & Gray LLP; Robert R. Jackson (57) ABSTRACT

An integrated circuit (e.g., a programmable integrated circuit such as a programmable microcontroller, a programmable logic device, etc.) includes high-speed serial data signal interface channels, some of which include more circuitry that is dedicated to performing various high-speed serial interface functions than others of those channels have. To increase the flexibility with which such circuitry in a more feature-rich channel can be used, routing is provided for selectively allowing a less feature-rich channel to use certain dedicated circuitry of a more feature-rich channel that is not itself using all of its dedicated circuitry.

20 Claims, 6 Drawing Sheets

FLEXIBLE HIGH-SPEED SERIAL INTERFACE ARCHITECTURES FOR PROGRAMMABLE INTEGRATED CIRCUIT DEVICES

BACKGROUND OF THE INVENTION

This invention relates to integrated circuit devices, and more particularly to high-speed serial interface circuitry on programmable integrated circuit devices.

High-speed serial data signalling has become of great interest in many contexts in recent years. It has therefore become of great interest to give integrated circuit devices and especially programmable integrated circuit devices such as programmable microcontrollers, programmable logic devices ("PLDs"), etc., the ability to support such signalling. High-speed serial data signalling can take any of many different forms, making it desirable for an integrated circuit of any of the above kinds to be able to support any of many different types and/or arrangements of such signalling. Some of these forms may be industry-standard forms or protocols. Others may be modifications of industry-standard forms or protocols. Still others may be completely or at least very extensively customized by various users. Many forms use several (e.g., four) serial channels in parallel (i.e., a so-called quad of channels). Other forms use only a single serial channel or several serial channels individually.

Because of the many different ways in which various users of integrated circuits of the above kinds may wish to use those products for high-speed serial data signalling, it is desirable for the high-speed serial interface ("HSSI") circuitry such a product to have an architecture (i.e., an organization) that permits flexible use of those HSSI resources.

SUMMARY OF THE INVENTION

In accordance with certain possible aspects of the invention, an integrated circuit may include first and second channels of high-speed serial data signal interface circuitry. The first channel has a relatively large set of circuit blocks that are at least partly hard-wired to perform functions for implementing various aspects of a high-speed serial data signal interface operation. The second channel has a smaller and therefore more limited set of such circuit blocks. The programmable logic device may further include circuitry for selectively allowing the second channel to make use of circuit blocks of the first channel that are not in the second channel's set of blocks and that are not being used by the first channel.

In accordance with other possible aspects of the invention, an integrated circuit may include a group of first high-speed serial data signal interface channels, each of which includes physical media attachment circuitry and physical coding sublayer circuitry. The device may further include a second high-speed serial data signal interface channel which includes physical media attachment circuitry but no physical coding sublayer circuitry. The device still further includes circuitry for selectively allowing the second channel to use the physical coding sublayer circuitry of one of the first channels that is not using its physical coding sublayer circuitry.

In accordance with still other possible aspects of the invention, an integrated circuit may include programmable circuitry. The device may further include a group of first high-speed serial data signal interface channels, each of which includes physical media attachment circuitry and physical coding sublayer circuitry. The group also includes channel bonding circuitry that is selectively usable to synchronize data in multiple ones of the first channels. The device may still further include a second high-speed serial data signal interface channel which includes physical media attachment circuitry but no physical coding sublayer circuitry and which is not part of any group of channels that includes channel bonding circuitry. Yet a further component of the device is circuitry for allowing the physical media attachment circuitry of the second channel to be connected, via the programmable circuitry, to the physical coding sublayer circuitry of one of the first channels that is not otherwise using its physical coding sublayer circuitry.

Further features of the invention, its nature and various advantages, will be more apparent from the accompanying drawings and the following detailed description.

DETAILED DESCRIPTION

Although the invention is equally applicable to other types of integrated circuits (e.g., various kinds of programmable integrated circuits such as programmable microcontrollers, etc.), the invention will be fully understood from the following illustrative discussion of its application to the type of integrated circuits known as programmable logic devices ("PLDs").

Figure 1:
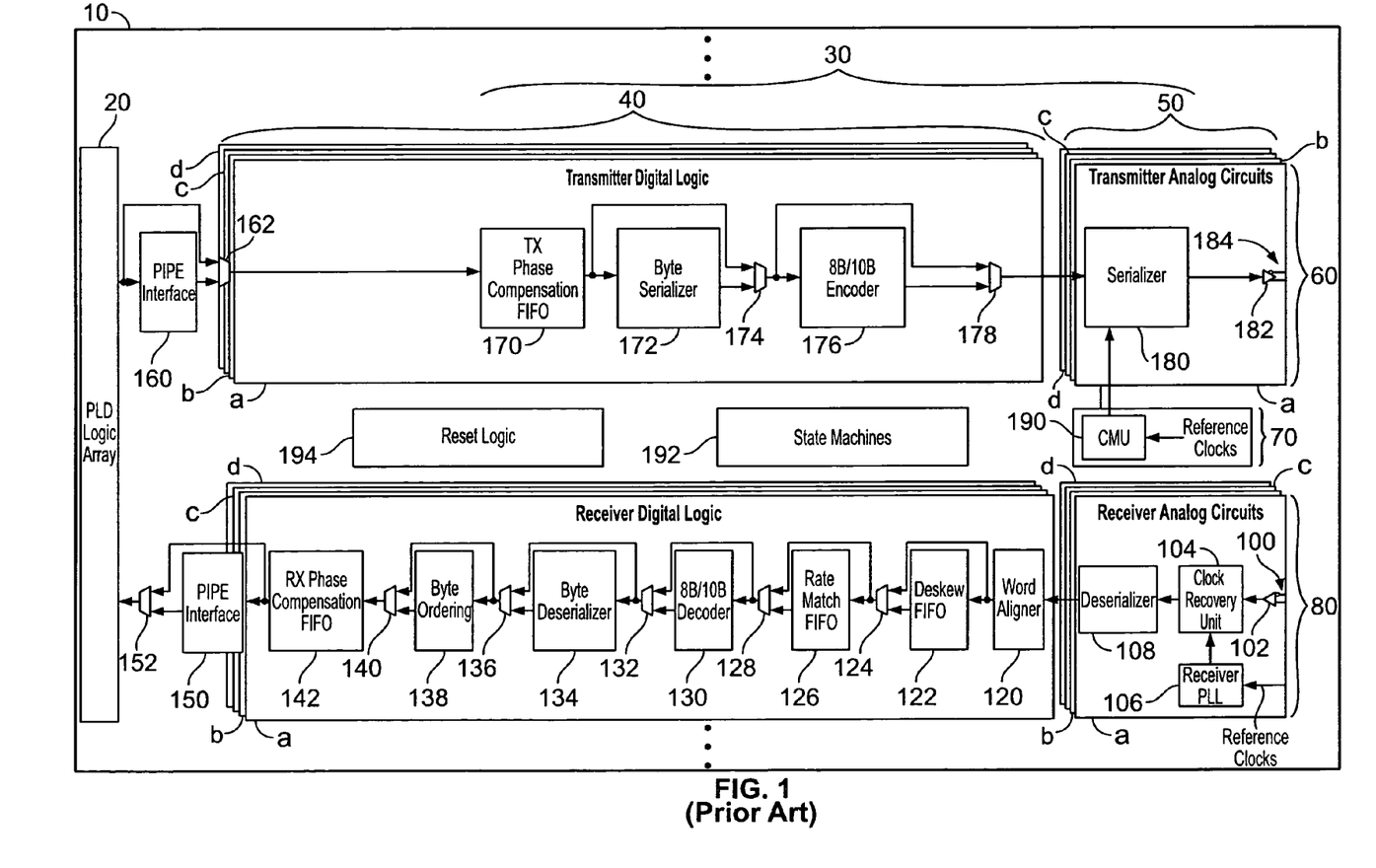
FIG. 1 is a simplified schematic block diagram of illustrative known integrated circuitry.

Illustrative known PLD circuitry is shown (in part) in FIG. 1. As shown in FIG. 1, PLD 10 includes a so-called PLD logic array 20 and one group or quad 30 of high-speed serial interface ("HSSI") or transceiver circuitry. PLD logic array 20 typically includes the programmable, general-purpose logic and interconnect circuitry of the PLD. As is known, PLD logic array 20 may also include other types of circuitry such as blocks of random access memory ("RAM"), blocks of digital signal processing ("DSP") circuitry, microprocessor circuitry, etc. HSSI circuitry 30 includes four channels of transmitter circuitry 60, four channels of receiver circuitry 80, and some circuitry 70 that is shared by circuitries 60 and 80. Each transmitter or receiver channel includes a predominately analog portion 50 (known as the physical media attachment or PMA layer) and a predominantly digital portion 40 (known as the physical coding sublayer or PCS).

Unlike PLD logic array 20, which is relatively general-purpose circuitry that is programmable to perform any of a very wide range of functions, PCS 40 and PMA 50 are typically made up of circuit blocks that are hard-wired (or at least hard-wired to a large degree) to perform particular functions. The function performed by such a PCS or PMA circuit block may be modifiable to some degree (e.g., by being based on one or more selectable parameter values, which values may be programmable into the device). But the basic function performed by each of these blocks is basically hard-wired into the block, and the block is therefore dedicated to performing that function.

The circuitry shown in FIG. 1 is all well known, so the following further discussion of it can be somewhat abbreviated.

On the receiver side, a serial data signal is typically received in differential form from an external source via leads 100. The signal on leads 100 is processed in turn by input buffer 102, clock and data recovery ("CDR") unit 104, and deserializer 108. CDR circuitry 104 works with one or more reference clock signals from receiver PLL (phase-locked loop) circuitry 106. Deserializer 108 converts the recovered serial data signal to parallel form (e.g., on eight or 10 parallel leads) for application to the associated receiver PCS circuitry 40.

Within receiver PCS circuitry 40 the parallel data is processed by word aligner 120, which can be used to find byte boundaries in the parallel data. The next several elements in receiver PCS circuitry 40 can either be used or bypassed, depending on how the downstream multiplexer (e.g., 124, 128, 132, 136, 140, and 152) is programmed. For example, deskew FIFO 122 can either be used or bypassed, depending on how multiplexer 124 is programmed. Deskew FIFO 122 can be used to ensure that bytes in the multiple receiver channels in quad 30 are properly synchronized with one another. For succeeding circuit blocks, only the blocks themselves will be mentioned (the downstream multiplexers will not be mentioned again). Rate matching FIFO can be used to compensate for possible differences in clock speed between the recovered clock signal (from CDR 104) and a clock used for downstream processing of the data. 8B/10B (eight-bit/ten-bit) decoder 130 can be used to convert data from 10-bit form to 8-bit form. Byte deserializer 134 can be used to place two successive bytes in parallel to further reduce the rate at which data must be clocked into PLD logic array 20. Byte ordering circuitry 138 can be used to further synchronize bytes in the various channels of quad 30. RX phase compensation FIFO 142 can be used to compensate for any phase difference between a clock signal used upstream from that element and a clock signal used downstream from that element. PIPE interface circuitry 150 can provide a well-known type of interface between the upstream circuitry and PLD logic array circuitry 20.

On the transmitter side, bypass multiplexers 162, 174, and 178 will again not be specifically mentioned because their functionality is clearly apparent from the drawing. PIPE interface circuitry 160 can provide a well-known type of interface between PLD logic array circuitry 20 and the downstream circuitry. TX phase compensation FIFO can compensate for any phase difference between a clock signal used upstream from that element and a clock signal used downstream from that element. Byte serializer 172 can be used to convert two bytes of data received in parallel from PLD logic array 20 to two successive parallel bytes of data. 8B/10B encoder 176 can be used to convert the data from 8-bit form to 10-bit form. From transmitter PCS circuitry 40 (just described) successive parallel data bytes are applied to the associated transmitter PMA 50.

In transmitter PMA 50 serializer 180 converts each successive parallel data byte to a serial data stream. Serializer 180 works with clock signals produced by clock management (or multiplier) unit ("CMU") 190. The serial data from serializer 180 is applied to output buffer 182 and thence to external circuitry (typically in differential form) via leads 184.

State machine circuitry 192 may be provided for such purposes as helping to synchronize the data between the several channels of quad 30 (so-called channel bonding, which also involves use of certain blocks in PCS circuitries 40). Reset logic 194 may be provided for such purposes as making sure that all channels of quad 30 are released from reset to begin operating in synchronism with one another.

Although the circuitry of only one receiver channel 80 and one transmitter channel 60 is shown in detail in FIG. 1, it will be understood that quad 30 includes four instances of such circuitry, the letters a-d pointing respectively to those four instance. A quad may include only one instance of components like 190, 192, and 194, these components serving all channels of the quad. The example of a "quad" having four channels that can work together (e.g., via common or shared components like 190, 192, and 194 to synchronize the data being handled in multiple channels) is only illustrative, and a "quad" or "group" may include any multiple number of channels that are similarly usable together to provide a multi-channel high-speed serial interface.

Figure 2:
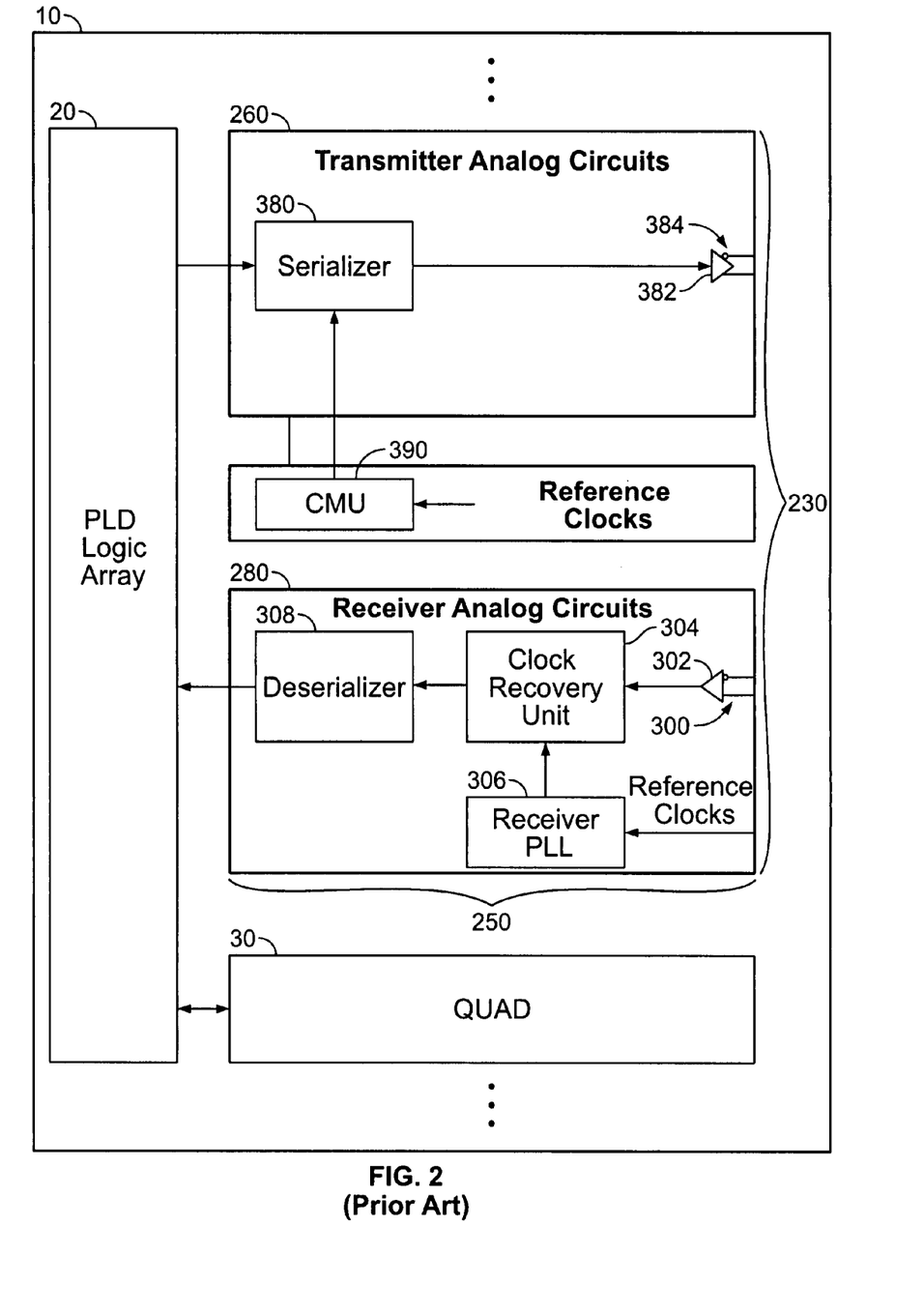
FIG. 2 is a simplified schematic block diagram of further illustrative known integrated circuitry.

FIG. 2 shows that, in addition to including one or more quads 30 as described above, PLD 10 may also include one or more channels of HSSI circuitry 230 that include only PMA circuitry 250 (i.e., these channels do not include PCS circuitry like the PCS circuitry 40 in quad 30). In prior art like that shown in FIG. 2, such a channel 230 can be used for single-channel high-speed serial communication. Any of the functions that a quad 30 performs in its PCS 40 that are needed to support communication via channel 230 can be implemented in PLD logic array 20. Two or more of channels 230 can be used together to support certain multi-channel serial communication; but again, any required channel bonding (which quad 30 performs in its PCS 40) must be implemented for channels like 230 in PLD logic array 20. For ease of reference a channel like 230 may sometimes be referred to as a "single channel" (to distinguish it from a quad, which includes multiple channels, or the several channels that make up a quad). By referring to a channel like 230 as a single channel, there is no intention to exclude the possibility of two or more such channels being used together. But if that is done in the prior art like FIG. 2, then any necessary coordination (e.g., synchronization) between such single channels that are being used together is provided by PLD logic array 20 as mentioned above. (A channel like 230 may also be known in the prior art as a 10 Gbps (gigabits per second) channel, because that may be its nominal maximum bit rate. But 10 Gbps is only an example, and channel 230 may instead have any other HSSI specification.)

The components of single-channel PMA 240 are similar to the PMA components of any channel in quad 30. This similarity is indicated by using reference numbers in FIG. 2 that are increased by 200 from the reference numbers used for similar PMA components in FIG. 1. Thus, for example, FIG. 2 elements 300, 302, 304, 306, 308, 380, 382, and 384 can be respectively similar to FIG. 1 elements 100, 102, 104, 106, 108, 180, 182, and 184. These FIG. 2 elements will therefore not need to be re-described. The earlier descriptions of the similar FIG. 1 elements apply again to these FIG. 2 elements.

From the foregoing it will be appreciated that quad channels like 60/80 have a larger set of functional circuit blocks than a non-quad channel like 230. At a macro level this larger set for a quad channel like 60/80 includes both PCS and PMA circuitry, while the smaller set for channel 230 includes only PMA circuitry. At a micro level, the larger set for a quad channel includes elements like 104, 108, 120, 122, 126, 130,

134, 138, 142, 170, 172, 176, and 180, while the smaller set for a non-quad channel includes a smaller number of elements like 304, 308, and 380.

Figure 3:
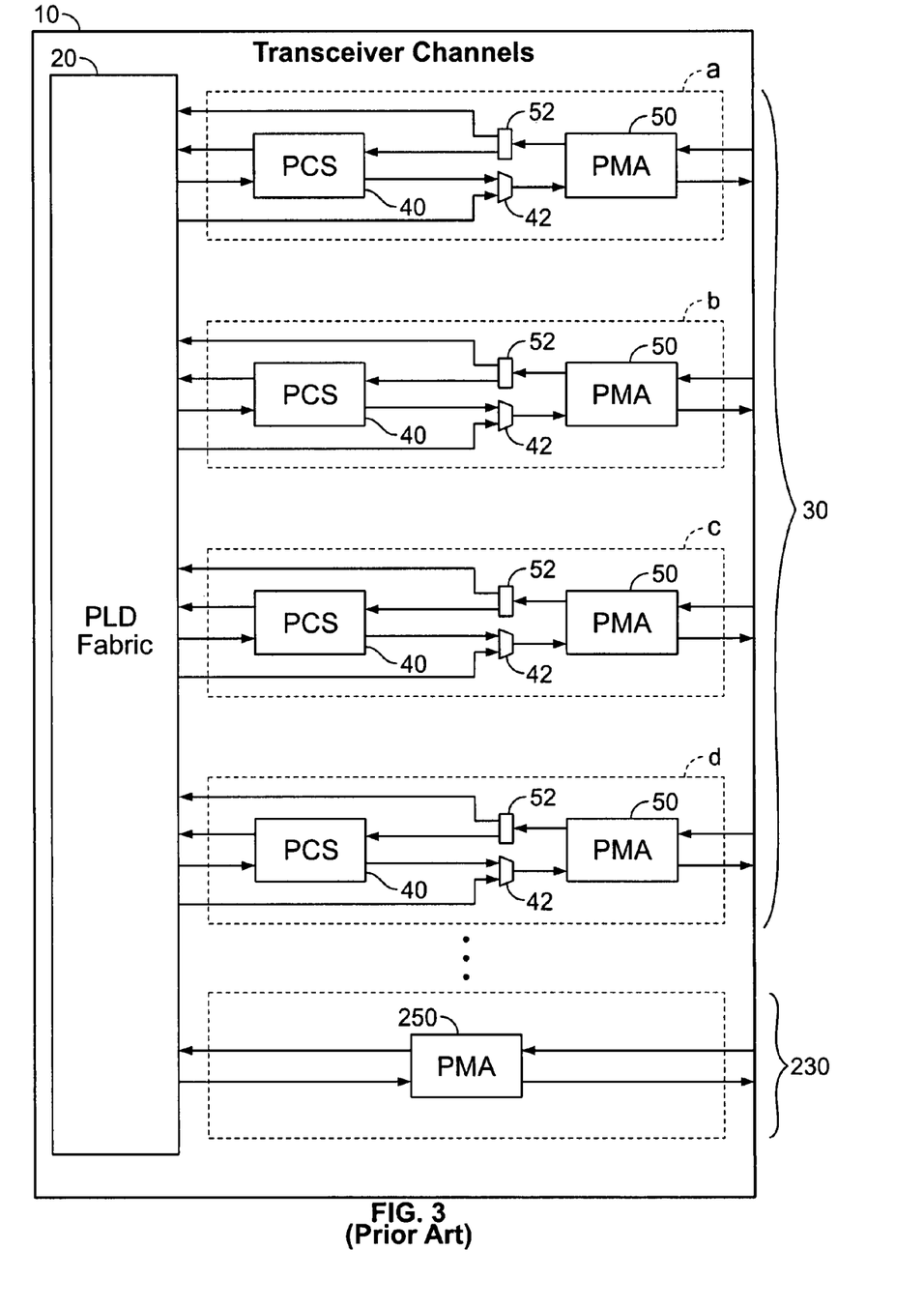
FIG. 3 is a simplified schematic block diagram of still further illustrative known integrated circuitry.

FIG. 3 shows that in current PLD HSSI transceiver architectures the PCS circuitry 40 in each quad channel is usable only in conjunction with the PMA circuitry 50 in that channel. In each quad channel, demultiplexer 52 allows the signals received by that channel to either use or bypass the PCS 40 of that channel. Similarly, in each quad channel, multiplexer 42 allows the signals to be transmitted by that channel to either use or bypass the PCS 40 of that channel. But the PCS 40 in each quad channel is effectively dedicated to that channel. It is hard-wired for use (if at all) only with PMA circuitry 50 of that channel. If the PCS 40 in any channel is bypassed or otherwise unused, it is not usable in any other way. For example, the PCS 40 of one or more quad channels may be bypassed and therefore unused if the communication protocol being implemented by that channel does not need or cannot use the capabilities that have been built into the PCS blocks of the PLD. In such a case it may be necessary to implement PCS-like functions for these quad channels in PLD fabric 20. But in any event, the unused PCS 40 resources are not accessible for any other purpose or use.

Figure 4:
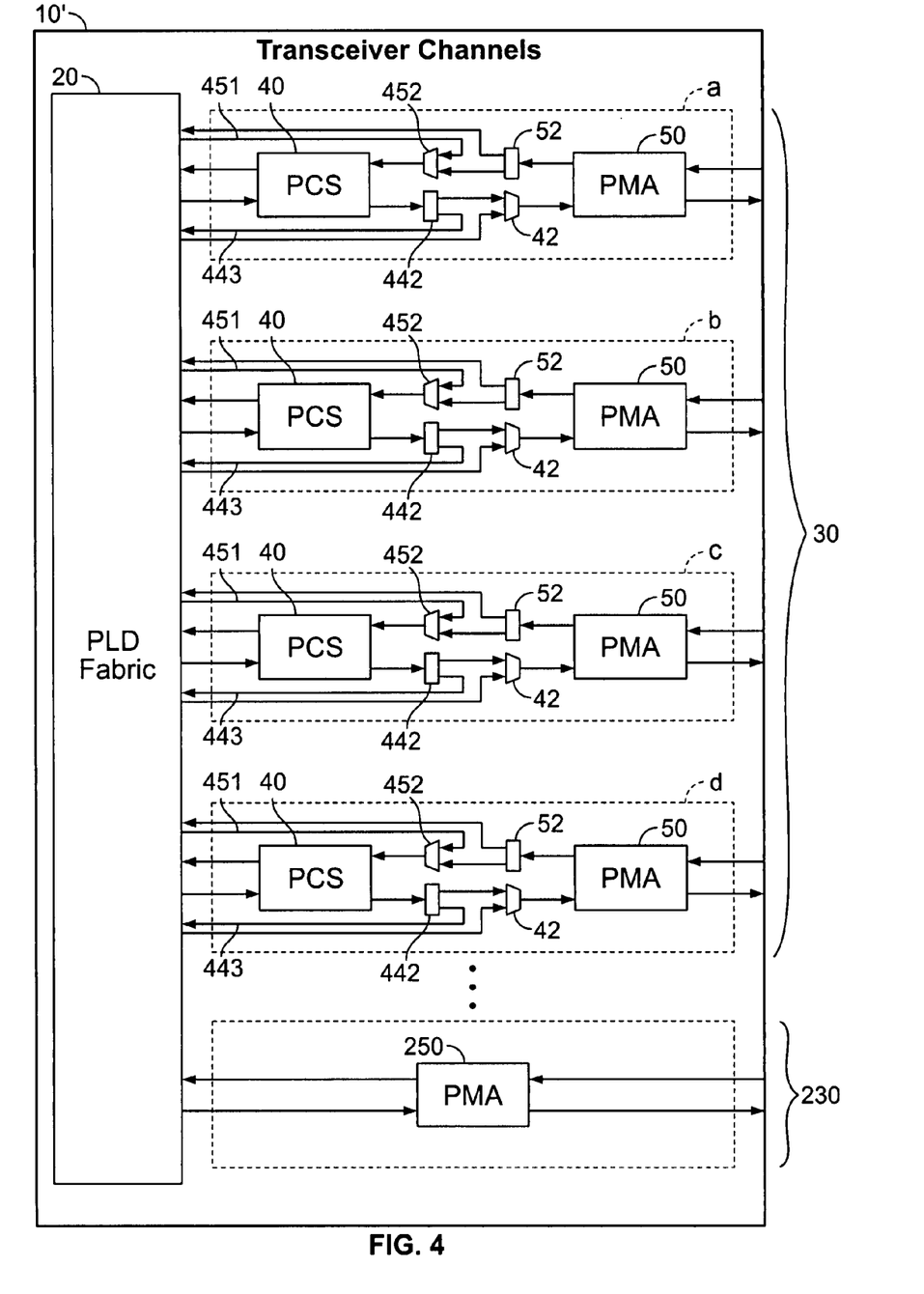
FIG. 4 is a simplified schematic block diagram that is generally similar to FIG. 3, but that shows an illustrative embodiment of the present invention.

FIG. 4 shows an illustrative embodiment of circuitry in accordance with the invention that makes it possible to use, for other purposes, PCS resources 40 in a quad 30 that are not being used by that quad. In FIG. 4 the PLD is identified as 10'. It will be understood, however, that except for the differences mentioned below, PLD 10' can be basically the same as above-described PLD 10.

In PLD 10' each PCS 40 in quad 30 can get received data signals from either the associated PMA 50 (as in the earlier FIGS.) or from PLD logic array or fabric 20. This is made possible by including multiplexer circuitry 452 in the bus that leads from each quad PMA 50 to the associated quad PCS 40, and by adding a bus 451 from PLD fabric 20 to the second set of selectable inputs to each such multiplexer circuitry 452. Thus each of multiplexer circuitries 452 can supply received data signals to the associated PCS 40 from either the associated quad PMA 50 or from PLD fabric 20, depending on which of its two sets of inputs the multiplexer selects to be its output signals.

In addition to thus being able to get received data signals from either of two sources, each PCS 40 can output data signals to be transmitted to either the associated quad PMA 50 or to PLD fabric 20 via demultiplexer circuitry 442 and bus 443.

Figure 5:
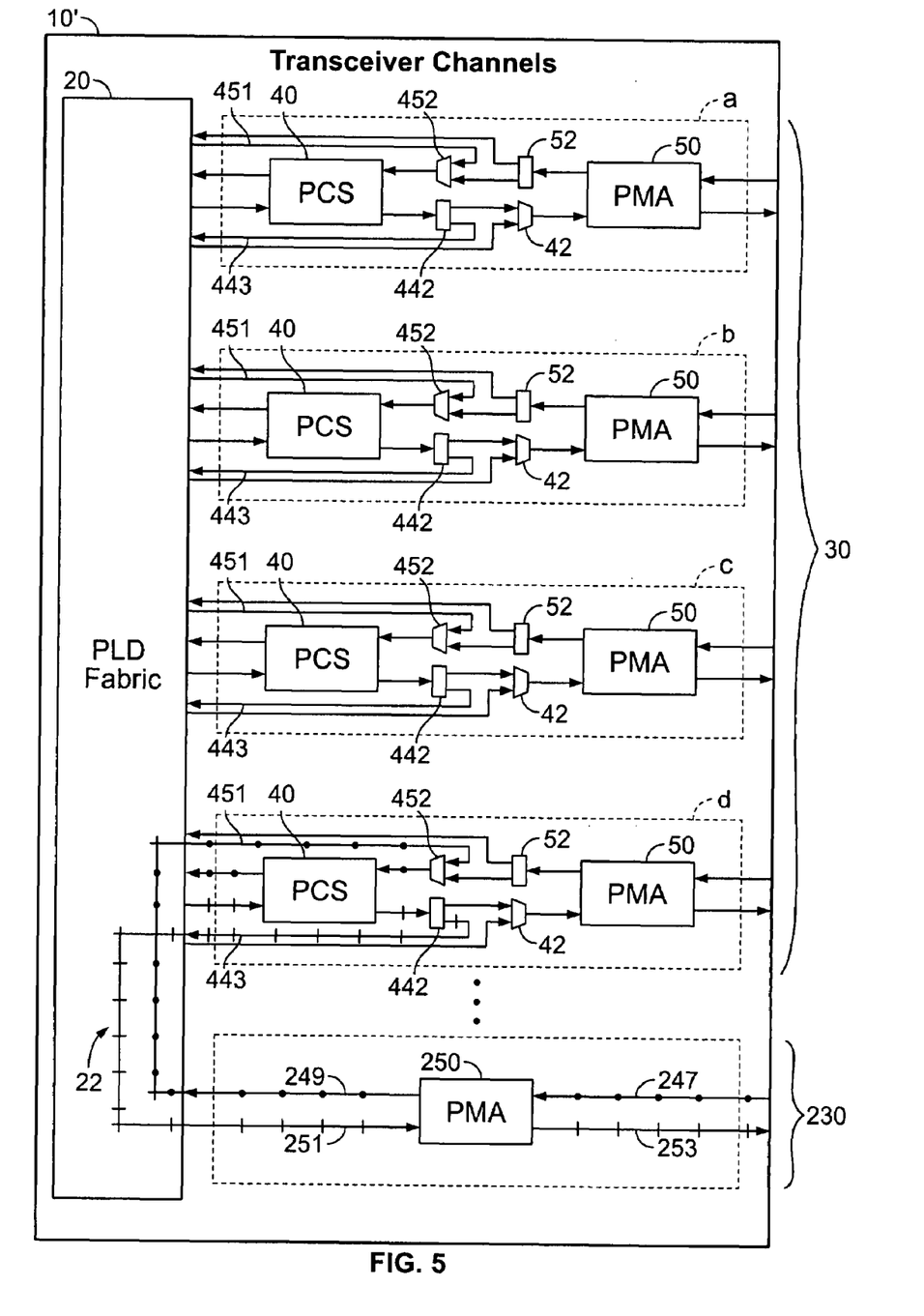
FIG. 5 is similar to FIG. 4, but shows an illustrative use of the FIG. 4 circuitry in accordance with the invention.

FIG. 5 shows an example of how the elements 442, 443, 451, and 452 that have been added as shown in FIG. 4 make it possible to use any quad PCS 40 that is not being used by that quad for another purpose (in this case to perform PCS functions for a PMA 250 that is not part of quad 30). As shown in FIG. 5, non-quad (single-channel) PMA 250 receives a serial data signal via the lead(s) referenced 247. The received data signals that result from operation of PMA 250 on the received serial data signal are applied to PLD fabric 20 via bus 249. Within logic fabric 20 the interconnection or routing resources 22 of that fabric can be used to route the signals from bus 249 to any of many programmably selectable destinations. In the example shown in FIG. 5, at least one of the programmably selected destinations is the bus 451 of channel d in quad 30. (Other selectable destinations preferably include the buses 451 in quad channels a-c so that any quad channel can be used in the way that quad channel d is used in the FIG. 5 example.) Multiplexer 452 in quad channel d is programmably controlled to connect bus 451 to the received data inputs of the PCS 40 in that channel. The receiver side circuitry of this PCS can then be used to perform any of the available PCS functions on the received data from PMA 250 and to output the results to PLD fabric 20. In this way PCS 40 in channel d (or any other quad 30 channel) that is not being used by the quad can instead be used to perform PCS functions on received data from another channel (e.g., PMA 250) that is not part of quad 30. For extra clarity, the above-described received data path through PMA 250, PLD fabric 20, PCS 40 in channel d, and back to PLD fabric 20 is emphasized by placing dots along the leads in that path.

Alternatively or in addition, the transmit side of a quad channel PCS 40 that is not being used by that quad can instead be used to support data transmission by another channel that is not part of the quad. An example of this is shown by the signal routing path in FIG. 5 on which transverse tick marks have been placed. Once again this example assumes that PCS 40 in quad channel d is not being used by that quad channel. Data signals to be transmitted via non-quad channel PMA 250 can be applied to PCS 40 in quad channel d. The transmit side of this PCS circuitry can be used to perform any of its available functions on these signals and to output the results to the associated demultiplexer circuitry 442. This demultiplexer routes the signals it receives back to PLD fabric 20 via bus 443. Interconnection resources 22 in fabric 20 are used to route these signals to the bus 251 leading to PMA 250. The serial data output signal of PMA 250 is transmitted from PLD 10' via lead(s) 253.

The foregoing demonstrates that the circuitry of this invention allows either or both of the following types of operations. First, PCS circuitry 40 of a quad channel that is not being used for data reception via that quad channel can instead be used to perform PCS functions on data being received via a channel outside the quad (which may be a channel that does not have its own dedicated PCS circuitry). Alternatively or in addition, PCS circuitry of a quad channel that is not being used for data transmission via that quad channel can instead be used to perform PCS functions on data being transmitted via a channel outside the quad (which again may be a channel that does not have its own dedicated PCS circuitry).

Examples of circumstances that may leave PCS circuitry 40 of a quad unused are (1) the quad is not being used, (2) a particular channel in the quad is not being used, or (3) the PCS-type functions required for the signals in a channel are not available from the dedicated PCS circuitry that has been provided and must instead be performed in the general-purpose logic 20 of the PLD. Whenever quad PCS circuitry 40 is thus available and can be used to perform the PCS functions needed by another channel (like 250) that does not have its own dedicated PCS circuitry, the PCS functions for that channel (like 250) do not have to be performed in the general-purpose logic 20 of the PLD. This can result in considerable savings in the amount of PLD fabric 20 that is required to support the user's application.

In some situations, only part of a quad PCS 40 may be unused by that quad. For example, only the transmitter side of that PCS 40 may be used, or only the receiver side may be used. Then only the thus unused part of such quad PCS circuitry 40 maybe used by a non-quad channel (like 250) in the manner described above in connection with FIGS. 4 and 5.

It will be understood that the routing circuitry 22 shown in FIG. 5 is typically programmably controllable interconnection circuitry (which can be like or even part of the general-purpose interconnection circuitry of PLD fabric 20). This circuitry can typically route signals between various signal sources and destinations, and the particular routing that is implemented in any particular instance is typically programmably selectable.

Figure 6:
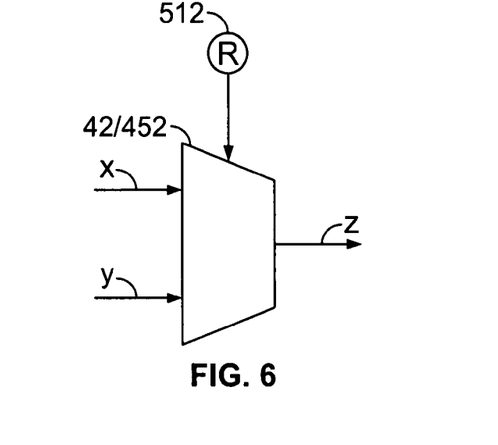
FIG. 6 is a simplified schematic block diagram of an illustrative embodiment of a representative portion of the circuitry of earlier FIGS. in accordance with the invention.

FIG. 6 illustrates typical programmable control of multiplexer circuitry like 42 or 452. A programmable configuration memory cell 510 is associated with multiplexer 42/452. This memory cell applies a programmably selectable selection control signal to multiplexer 42/452. Depending on the state of this selection control signal, multiplexer 42/452 applies either its x input(s) or its y input(s) to its z output(s). (The arrangement shown in FIG. 6 is also typical of how multiplexers like 124, 128, ..., and 178 elsewhere in the circuitry may be controllable. Technology like that shown in FIGS. 6 and 7 may also be used for controlling signal routing throughout PLD fabric 20 (e.g., routing 22).)

Figure 7:
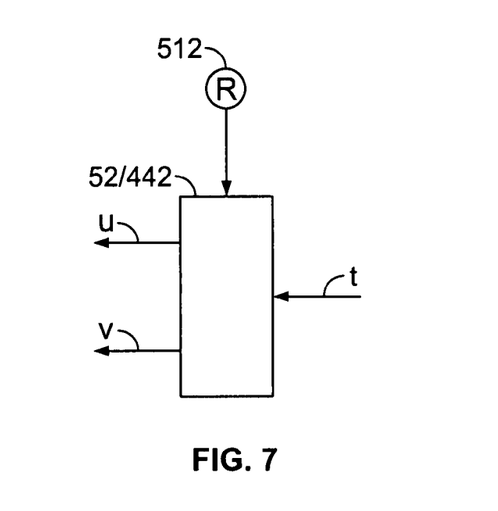
FIG. 7 is a simplified schematic block diagram of an illustrative embodiment of another representative portion of the circuitry of earlier FIGS. in accordance with the invention.

FIG. 7 illustrates a similar arrangement for demultiplexer circuitry like 52 or 442. Element 512 is similar to element 510 and applies a programmably selectable selection control signal to demultiplexer 52/442. Depending on the state of this selection control signal, demultiplexer 52/442 routes its t input signal(s) to either its u output(s) or its v output(s).

Figure 8:
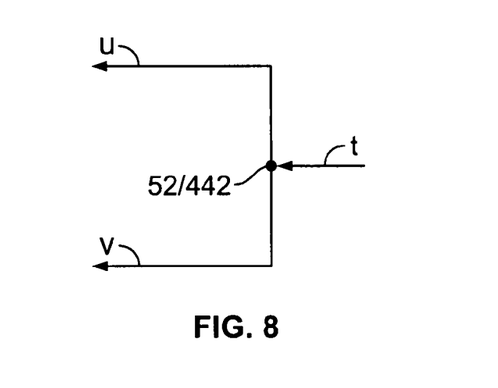
FIG. 8 shows an alternative embodiment of FIG. 6 type circuitry in accordance with the invention.

If excessive loading on input(s) t is not an issue, then it may be possible to replace actively controllable demultiplexers, as illustrated by FIG. 7, by passive demultiplexing nodes as illustrated by FIG. 8. Such a passive demultiplexing node always distributes signal(s) t to both output paths u and v.

It will be understood that the foregoing is only illustrative of the principles of the invention, and that various modifications can be made by those skilled in the art without departing from the scope and spirit of the invention. For example, the particular functions that are hard-wired (or at least partly hard-wired) into circuit blocks like the various PMA and PCS blocks shown and described herein are only illustrative. Various such PMA and/or PCS functions that are shown herein can be omitted if desired, other functions can be substituted, and/or still more functions can be added. As a general point (already mentioned earlier in this specification), it will be appreciated that such PMA/PCS functions are typically provided by circuitry that is dedicated or hard-wired to at least a significant extent to perform particular functions or at least functions of a particular type. These PMA/PCS circuit blocks may be programmably controllable to a certain extent, but they are primarily dedicated or hard-wired circuit blocks. In this respect they are fundamentally different from at least much of PLD fabric 20, which to a large extent is typically general-purpose logic and general-purpose routing resources that are programmable to perform any of a very wide range of different functions using any of a very wide range of different interconnection arrangements.

Although programming of various functions and routings using field-programmable approaches, such as field-programmable memory cells on PLD 10/10', is mentioned most often above, it will be understood that similar end results can be achieved in other ways, such as by using mask programming of the device during its fabrication. As used herein and in the appended claims, the term "programming", "programmable", or the like refers to all of these ways of giving an integrated circuit device, which has at least a basic architecture, a final configuration. Thus for example, an integrated circuit can be field-programmable, mask-programmable, or programmable in any other way (such as by programming memory cells, making or breaking fuse or anti-fuse connections or metal optional links, etc.), and such programming can be one-time-only or repeatable (e.g., to reprogram the device to change its function).

Again, although the invention has been illustratively described for the most part herein in the context of PLDs, the invention is equally applicable to any type of integrated circuit, especially integrated circuits that are programmable.

The invention claimed is:

1. An integrated circuit comprising:
a first channel of high-speed serial data signal interface circuitry having a relatively large set of circuit blocks that are at least partly hard-wired to perform functions for implementing various aspects of a high-speed serial data signal interface operation;
a second channel of high-speed serial data signal interface circuitry having a relatively small set of circuit blocks that are at least partly hard-wired to perform functions for implementing various aspects of a high-speed serial data signal interface operation; and
circuitry for selectively allowing the second channel to make use of circuit blocks of the first channel that are not in the second channel's set of circuit blocks and that are not being used by the first channel, wherein the relatively large set comprises:
physical media attachment blocks; and
physical coding sublayer blocks, and wherein the circuitry for selectively allowing comprises:
multiplexer circuitry for selectively applying to the physical coding sublayer blocks signals from either the physical media attachment blocks or the second channel.

2. The integrated circuit defined in claim 1 wherein the relatively small set comprises:
the relatively large set minus the physical coding sublayer blocks.

3. The integrated circuit defined in claim 1 wherein the circuitry for selectively allowing further comprises:
interconnection circuitry in programmable circuitry of the integrated circuit.

4. The integrated circuit defined in claim 3 wherein the interconnection circuitry is programmable to at least some degree to select signal routing that the interconnection circuitry will effect.

5. The integrated circuit defined in claim 1 wherein the first channel is one of a plurality of similar channels that form a group of channels that are usable together to support multi-channel high-speed serial data communication.

6. The integrated circuit defined in claim 5 wherein the group includes dedicated channel bonding circuitry for optionally synchronizing data in multiple ones of the channels in the group.

7. The integrated circuit defined in claim 6 wherein the second channel is not part of any group of channels that includes dedicated channel bonding circuitry.

8. The integrated circuit defined in claim 1 wherein both the relatively large and relatively small sets include serial-to-parallel data converter circuitry, but only the relatively large set includes 8-bit/10-bit decoder circuitry.

9. The integrated circuit defined in claim 1 wherein both the relatively large and relatively small sets include parallel-to-serial data converter circuitry, but only the relatively large set includes 8-bit/10-bit encoder circuitry.

10. The integrated circuit defined in claim 1 wherein the relatively large set includes at least one block selected from the following group which the relatively small set does not include: a word aligner block, a deskew FIFO block, a rate matching FIFO block, an 8-bit/10-bit decoder block, a byte deserializer block, a byte ordering block, and a receiver phase compensation FIFO block.

11. The integrated circuit defined in claim 1 wherein the relatively large set includes at least one block selected from the following group which the relatively small set does not include: a transmitter phase compensation FIFO block, a byte deserializer block, and an 8-bit/10-bit encoder block.

12. The integrated circuit defined in claim 1 wherein the integrated circuit comprises a programmable integrated circuit.

13. An integrated circuit comprising:
- a group of first high-speed serial data signal interface channels, each of which includes physical media attachment circuitry and physical coding sublayer circuitry;
- a second high-speed serial data signal interface channel which includes physical media attachment circuitry but no physical coding sublayer circuitry; and
- circuitry for selectively allowing the second channel to use the physical coding sublayer circuitry of one of the first channels that is not using its physical coding sublayer circuitry, wherein the circuitry for selectively allowing comprises:
- multiplexer circuitry having a first set of selectable inputs connectable to outputs of the physical media attachment circuitry of said one of the first channels, a second set of selectable inputs connectable to outputs of the physical media attachment circuitry of the second channel, and outputs connectable to inputs of the physical coding sublayer circuitry of said one of said first channels.

14. The integrated circuit defined in claim 13 further comprising:
- programmable circuitry including programmable interconnection resources, and wherein the circuitry for selectively allowing uses the programmable interconnection resources for routing signals between the physical media attachment circuitry of the second channel and the physical coding sublayer circuitry of the one of the first channels that is not using its physical coding sublayer circuitry.

15. The integrated circuit defined in claim 13 wherein the outputs of the physical media attachment circuitry of the second channel are selectively connectable to the second set of inputs via programmably controllable interconnection circuitry of the device.

16. The integrated circuit defined in claim 13 wherein the circuitry for selectively allowing further comprises:
- demultiplexer circuitry having inputs connectable to outputs of the physical coding sublayer circuitry of said one of the first channels, a first set of selectable outputs connectable to inputs of the physical media attachment circuitry of said one of the first channels, and a second set of selectable outputs connectable to inputs of the physical media attachment circuitry of said second channel.

17. The integrated circuit defined in claim 16 wherein the second set of outputs is selectively connectable to the inputs of the physical media attachment circuitry of the second channel via programmably controllable interconnection circuitry of the device.

18. The integrated circuit defined in claim 13 wherein the integrated circuit comprises a programmable integrated circuit.

19. An integrated circuit comprising:
- programmable circuitry;
- a group of first high-speed serial data signal interface channels, each of which includes physical media attachment circuitry and physical coding sublayer circuitry;
- a second high-speed serial data signal interface channel which includes physical media attachment circuitry but no physical coding sublayer circuitry; and
- circuitry for selectively allowing the physical media attachment circuitry of the second channel to be connected, via the programmable circuitry, to the physical coding sublayer circuitry of one of the first channels that is not otherwise using its physical coding sublayer circuitry, and for selectively disconnecting the physical media attachment circuitry of said one of the first channels from the physical coding sublayer circuitry of that channel when the physical media attachment circuitry of the second channel is connected to the physical coding sublayer circuitry of said one of the first channels.

20. The integrated circuit defined in claim 19 wherein the integrated circuit comprises a programmable integrated circuit.

\* \* \* \* \*